(12) United States Patent
Green et al.

(10) Patent No.: US 10,522,670 B2
(45) Date of Patent: *Dec. 31, 2019

(54) SEMICONDUCTOR DEVICE WITH SELECTIVELY ETCHED SURFACE PASSIVATION

(71) Applicant: NXP USA, Inc., Austin, TX (US)

(72) Inventors: Bruce M. Green, Gilbert, AZ (US);
Darrell G. Hill, Chandler, AZ (US);
Karen E. Moore, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/587,276

(22) Filed: May 4, 2017

(65) Prior Publication Data

US 2017/0236929 A1   Aug. 17, 2017

Related U.S. Application Data

(60) Continuation-in-part of application No. 14/827,755, filed on Aug. 17, 2015, now Pat. No. 9,799,760, (Continued)

(51) Int. Cl.
*H01L 29/778*   (2006.01)
*H01L 29/40*   (2006.01)
(Continued)

(52) U.S. Cl.
CPC ...... *H01L 29/7787* (2013.01); *H01L 21/0217* (2013.01); *H01L 21/02178* (2013.01);
(Continued)

(58) Field of Classification Search
CPC . H01L 29/778; H01L 29/205; H01L 29/0615; H01L 29/7787; H01L 29/66462;
(Continued)

(56) References Cited

U.S. PATENT DOCUMENTS 5,286,985 A   2/1994   Taddiken
6,529,034 B1  3/2003   Ranjan
(Continued)

OTHER PUBLICATIONS

Chen et al., "Fabrication of Enhancement-Mode AlGaN/GaN MISHEMTs by Using Fluorinated Al2O3 as Gate Dielectrics", IEEE Elect Dev. Lett., Oct. 2011, pp. 1373-1375, vol. 32, No. 10.
(Continued)

*Primary Examiner* — Thanh Y. Tran
(74) *Attorney, Agent, or Firm* — Bruce M. Green

(57) ABSTRACT

A semiconductor device includes a semiconductor substrate configured to include a channel, a gate supported by the semiconductor substrate to control current flow through the channel, a first dielectric layer supported by the semiconductor substrate and including an opening in which the gate is disposed, and a second dielectric layer disposed between the first dielectric layer and a surface of the semiconductor substrate in a first area over the channel. The second dielectric layer is patterned such that the first dielectric layer is disposed on the surface of the semiconductor substrate in a second area over the channel.

23 Claims, 11 Drawing Sheets

Related U.S. Application Data which is a division of application No. 13/533,651, filed on Jun. 26, 2012, now Pat. No. 9,111,868.

(51) Int. Cl.

| | |
|---|---|
| *H01L 29/205* | (2006.01) |
| *H01L 29/20* | (2006.01) |
| *H01L 21/285* | (2006.01) |
| *H01L 29/66* | (2006.01) |
| *H01L 21/311* | (2006.01) |
| *H01L 21/321* | (2006.01) |
| *H01L 21/02* | (2006.01) |
| *H01L 23/544* | (2006.01) |

(52) U.S. Cl.
CPC .. *H01L 21/02271* (2013.01); *H01L 21/28575* (2013.01); *H01L 21/31111* (2013.01); *H01L 21/31116* (2013.01); *H01L 21/321* (2013.01); *H01L 29/2003* (2013.01); *H01L 29/205* (2013.01); *H01L 29/402* (2013.01); *H01L 29/66462* (2013.01); *H01L 29/7786* (2013.01); *H01L 23/544* (2013.01); *H01L 2223/54426* (2013.01)

(58) Field of Classification Search
CPC ............... H01L 29/402; H01L 29/2003; H01L 29/1029; H01L 29/812; H01L 21/31116; H01L 21/28575; H01L 21/31111
See application file for complete search history.

(56) References Cited

U.S. PATENT DOCUMENTS

| | | | |
|---|---|---|---|
| 7,875,537 B2 | 1/2011 | Suvorov et al. | |
| 7,972,915 B2 | 7/2011 | Chen et al. | |
| 8,035,111 B2 | 10/2011 | Sheppard | |
| 8,076,699 B2 | 12/2011 | Chen et al. | |
| 8,728,884 B1 | 5/2014 | Hussain et al. | |
| 8,823,057 B2 | 9/2014 | Sheppard et al. | |
| 8,946,776 B2 | 2/2015 | Green et al. | |
| 9,029,986 B2 | 5/2015 | Green et al. | |
| 9,337,332 B2 | 5/2016 | Chu et al. | |
| 9,799,760 B2* | 10/2017 | Green | H01L 29/402 |
| 2003/0209811 A1 | 11/2003 | Holm et al. | |
| 2006/0197193 A1 | 9/2006 | Gu et al. | |
| 2007/0018199 A1 | 1/2007 | Sheppard et al. | |
| 2007/0164322 A1* | 7/2007 | Smith | H01L 29/42312 257/256 |
| 2007/0241419 A1 | 10/2007 | Green et al. | |
| 2008/0128752 A1 | 6/2008 | Wu | |
| 2009/0020823 A1 | 1/2009 | Fujita | |
| 2009/0146191 A1 | 6/2009 | Green et al. | |
| 2009/0159930 A1 | 6/2009 | Smorchkova et al. | |
| 2009/0230432 A1 | 9/2009 | Miyashita | |
| 2010/0120237 A1 | 5/2010 | Tanaka et al. | |
| 2011/0049526 A1* | 3/2011 | Chu | H01L 21/28587 257/76 |
| 2011/0057232 A1 | 3/2011 | Sheppard et al. | |
| 2011/0136305 A1* | 6/2011 | Saxler | H01L 29/66462 438/172 |
| 2012/0153301 A1 | 6/2012 | Shealy et al. | |
| 2012/0156836 A1 | 6/2012 | Shealy et al. | |
| 2012/0156843 A1 | 6/2012 | Green et al. | |
| 2012/0292663 A1* | 11/2012 | Lin | H01L 21/8252 257/190 |
| 2012/0319169 A1 | 12/2012 | Van Hove | |
| 2013/0009165 A1 | 1/2013 | Park et al. | |
| 2013/0015460 A1* | 1/2013 | Chen | H01L 21/28575 257/76 |
| 2013/0092947 A1 | 4/2013 | Green et al. | |
| 2013/0146893 A1 | 6/2013 | Thei et al. | |
| 2013/0168685 A1 | 7/2013 | Hsu et al. | |
| 2013/0277680 A1 | 10/2013 | Green et al. | |
| 2013/0341679 A1 | 12/2013 | Green et al. | |
| 2014/0077266 A1 | 3/2014 | Ramdani et al. | |
| 2015/0013715 A1 | 1/2015 | Ueda et al. | |
| 2015/0357452 A1 | 12/2015 | Green et al. | |

OTHER PUBLICATIONS

Dong Seup Lee et al., "300-GHz InAlN/GaN HEMTs with InGaN Back Barrier", IEEE Electronc Device Letters, Nov. 2011, pp. 1525-1527, vol. 32, No. 11.

Liu et al., "Improved Linearity for Low-Noise Applications in 0.25-μm GaN MISHEMTs Using ALO Al2O3 as Gate Dielectric", Elect. Dev. Lett., Aug. 2010, pp. 803-805, vol. 31, No. 8.

Marleen Van Hove et al., "CMOS Process-Compatible High-Power Low-Leakage AlGaN/GaN MISHEMT on Silicon", IEEE Electron Device Letters, May 2012, pp. 667-669, Vo. 33, No. 5.

"Seshadri Kolluri et al., ""N-Polar AlGaN/GaN MIS-HEMTs on SiC with a 16.7 W/mm Power Density at 10 GHzUsing an Al2O3 Based Eich Stop Technology for the Gate Recess"", IEEE conference publication, 69th Annual Device Research Conference, 2011, pp. 215-216".

Stephan Maroldt, "Gallium Nitride Based Transistors for High-Efficiency Microwave Switch-Mode Amplifiers", Ph. D Dissertation, Albert Ludwigs University, Jun. 2010, 10 pages, Freiburg, Germany.

Toshihiro Ohki et al., "Reliability of GaN HEMTs: Current Status and Future Technology", IEEE conference publication, 47th Annual International Reliability Physics Symposium, 2009, pp. 61-70.

Vetury et al., "Performance and RF Reliability of GaN-on-SiC HEMT's Using Dual-Gate Architectures", International Microwave Symposium Digest, 2006, pp. 714-717.

Wentzel et al., "RF Class-S Power Amplifiers: State of the Art Results and Potential", 2010 International Microwave Symposium Digest, Jun. 2010, pp. 812-815, Anaheim, CA.

Y. Xuan et al., "Capacitance-Voltage Studies on Enhancement-Mode InGaAs Metal-Oxide-Semiconductor Field-Effect Transistor Using Atomic-Layer-Deposited Al2O3 Gate Dielectric", Purdue University, Applied Physics Letters 88, 263518, Jun. 30, 2006, 4 pages.

Notice of Allowance dated Jun. 21, 2017 for U.S. Appl. No. 14827755 9 pages.

Non-Final Office Action dated Jun. 3, 2016 for U.S. Appl. No. 14/827,755 14 pages.

Final Office Action dated Dec. 1, 2016 for U.S. Appl. No. 14/827,755 23 pages.

Notice of Allowance dated Apr. 24, 2015 for U.S. Appl. No. 13/533,651 7 pages.

Non-Final Office Action dated Sep. 22, 2014 for U.S. Appl. No. 13/533,651 11 pages.

Non-Final Office Action dated May 17, 2018 for U.S. Appl. No. 15/652,146 20 pages.

Final Office Action; U.S. Appl. No. 15/652,146; dated Feb. 26, 2019; 21 pages.

* cited by examiner

SEMICONDUCTOR DEVICE WITH SELECTIVELY ETCHED SURFACE PASSIVATION

RELATED APPLICATIONS

This application is a continuation-in-part of U.S. patent application Ser. No. 14/827,755, filed on Aug. 17, 2015, entitled "Semiconductor Device with Selectively Etched Surface Passivation," which is a divisional of U.S. patent application Ser. No. 13/533,651 filed on Jun. 26, 2012, entitled "Semiconductor Device with Selectively Etched Surface Passivation," and now issued as U.S. Pat. No. 9,111,868, both of which are incorporated herein by reference in their entirety.

TECHNICAL FIELD

The present embodiments relate to semiconductor devices.

BACKGROUND

Gallium nitride (GaN) high electron mobility transistor (HEMT) devices have high breakdown voltages and high cutoff frequencies. Such devices are accordingly useful in high power and high efficiency amplifiers and other devices for high frequency communications and other high frequency applications. HEMT devices are also known as heterojunction field effect transistor (HFET) devices in reference to the derivation of a transistor from a heterostructure.

Aluminum gallium nitride (AlGaN)/GaN heterostructures are capable of high speed switching and present high breakdown voltages because of the high breakdown field strength of GaN and the high electron sheet density of the AlGaN/GaN heterojunction. The high breakdown field strength and high electron sheet density arise from the wide 3.4 eV bandgap of GaN. This bandgap is much wider than the bandgap of other semiconductor materials, such as Si (1 eV bandgap) and GaAs (1.6 eV bandgap). Such GaN heterostructures are accordingly often used in devices calling for highly efficient operation.

GaN HEMT devices have suffered from leakage current and trap-related phenomena, such as current collapse and quiescent current drift. GaN HEMT devices may degrade upon the formation of defects in an AlGaN barrier layer of the device. The defects provide a leakage path for electrons and effectively lower the Schottky barrier height of the gate. Current collapse is a frequency dispersion phenomenon, and may result from surface and buffer traps.

Field plates have been used to reduce the electric field at the gate edge. The reduction in the electric field in that region may address issues of device degradation and current collapse. GaN caps have also been used to reduce the electric field at the gate edge and improve surface morphology. Silicon nitride films have also been used to decrease the influence of surface traps in the interest of addressing current slump. Despite these efforts, gate leakage remains a problem for AlGaN/GaN HFET devices with Schottky gates.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION

Figure 1:
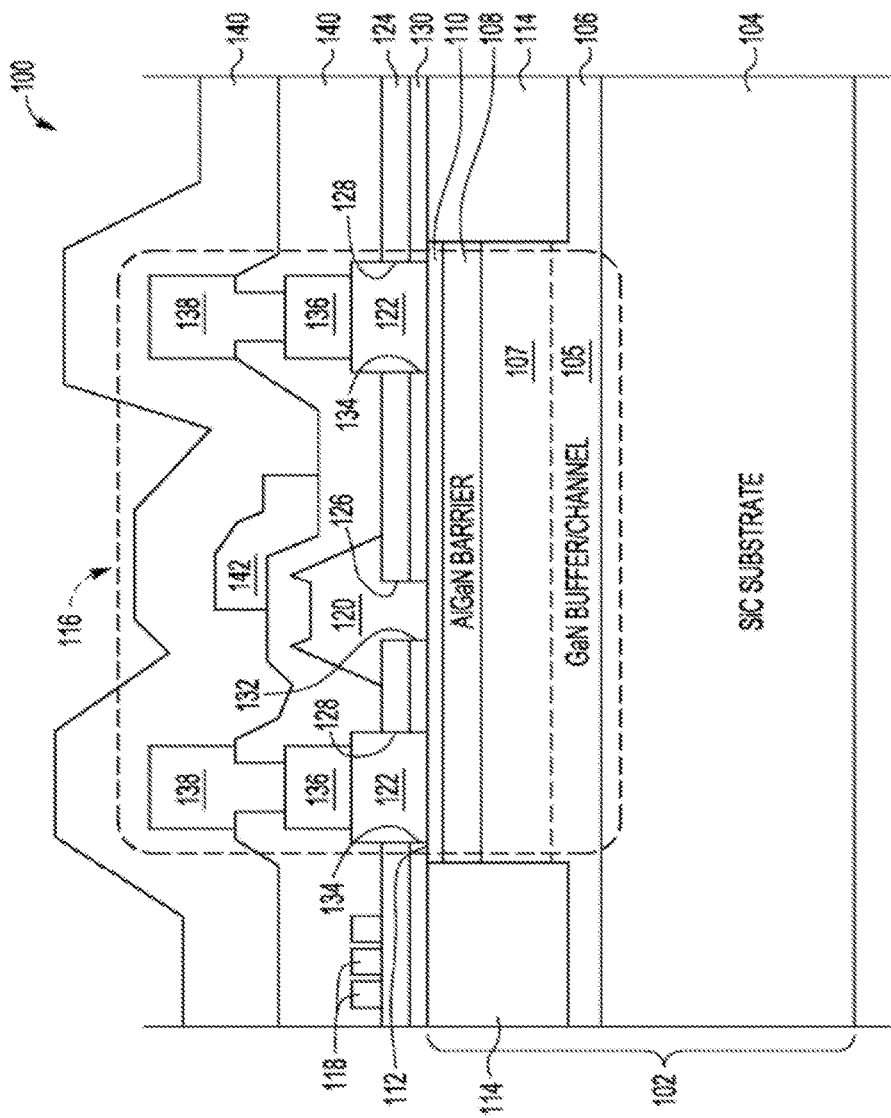
FIG. 1 is a schematic, cross-sectional view of a semiconductor device having selectively etched surface passivation layers in accordance with one embodiment.

GaN transistor devices with selectively etched surface passivation are described. The selective etching addresses damage that may otherwise occur due to reactive ion etch (RIE), inductively coupled plasma (ICP), or other dry etch procedures used in connection with gate and ohmic contact formation. Gate leakage and inconsistent ohmic contact resistance that may otherwise arise from such damage may thus be reduced. To avoid or address such problems, the disclosed devices include multiple dielectric layers for surface passivation. The multiple dielectric layers may be selectively etched in connection with the gate and/or the ohmic contacts. The surface damage may thus be avoided while still allowing the surface to be passivated in some portions of the device active area by a desired dielectric material, such as silicon nitride ($Si_3N_4$). For these and other reasons, the disclosed devices may have consistently lower gate leakage and ohmic contact resistances.

The selective etching of the surface passivation may include or involve different etch processing of the dielectric layers to define gate and ohmic contact areas. One dielectric layer may be wet etched, and act as an etch stop for the RIE procedure used to etch another dielectric layer. Etch damage from such RIE procedures may thus be avoided. The absence of etch damage may, in turn, reduce or eliminate gate leakage in Schottky gate HFET devices, such as AlGaN/GaN HFET devices, in which a dielectric material is deposited on the surface at or near the gate area to address current collapse. The absence of etch damage may also improve the consistency of the ohmic contact resistance.

The selective etching of the dielectric layers may alternatively or additionally include or involve the patterning of the dielectric layer configured for use as an RIE etch stop.

The surface passivation in the active area may thus vary as described herein. The patterning may be used to localize the coverage of the etch stop dielectric to selected areas, such as the gate and/or ohmic contact areas and areas proximate thereto to ensure complete coverage of the gate and/or ohmic contact areas. The selective coverage of the etch stop layer may allow one or more portions of the active area to be passivated by $Si_3N_4$, the presence of which at the surface may help prevent current collapse. For example, such $Si_3N_4$-based passivation may tend to increase the doping of GaN layers because of nitrogen vacancies at the device surface. In contrast, portions of the active area in contact with or abutting the gate and/or ohmic contact areas may be passivated by the etch stop dielectric so that the etch stop dielectric may be used to protect the gate and ohmic contact areas. Such non-nitride surface passivation in areas near the gate area may be useful to avoid a reaction between $Si_3N_4$ and one or more Schottky metals, such as nickel, which may otherwise form a conductive nickel silicide (NiSi) layer capable of causing leakage at the device surface.

Although described below in connection with AlGaN/GaN HFET devices, the selective etching of the disclosed devices and methods is well suited for use in connection with other devices. For example, the disclosed devices may utilize a wide variety of semiconductor materials, including other types of Group III-nitride semiconductor materials such as those that contain indium (In) (e.g., InAlN and InGaN). The disclosed devices are also not limited to Group III-nitride semiconductors, and may instead include other compound semiconductor materials, such as non-nitride-based compound semiconductors including, but not limited to, gallium arsenide (GaAs), indium phosphide (InP), indium antimonide (InSb), as well as Group II-Group VI semiconductor materials.

The disclosed devices are also not limited to HFET device configurations. For example, one or more aspects of the disclosed devices and methods may be applied in connection with metal-semiconductor FET (MESFET) devices. The disclosed devices are accordingly not limited to device structures having un-doped semiconductor layers.

The disclosed devices are also not limited to device configurations directed to a particular application or a high voltage context, and may be used in contexts other than RF and power switching.

FIG. 1 is a schematic, cross-sectional view of an exemplary epitaxial GaN transistor device 100 having selectively etched surface passivation in accordance with one embodiment. The transistor device 100 is configured as an HFET or HEMT device. The transistor device 100 includes a semiconductor substrate 102 in which a heterojunction structure is formed on a base substrate 104. In this example, the base substrate 104 includes SiC. The base substrate 104 may include alternative or additional materials, such as sapphire, Si, GaN, AlN, diamond, poly-SiC, SiC on insulator, silicon on insulator, and other substantially insulating materials.

The semiconductor substrate 102 includes a number of semiconductor layers supported by the base substrate 104 and configured in a heterostructure arrangement. Each of the semiconductor layers may be a Group III-nitride semiconductor epitaxial layer. In other embodiments, one or more of the semiconductor layers is not epitaxially grown. In this example, a buffer/channel layer 106 is grown on the base substrate 104 and configured as a channel and buffer of the transistor device 100. A bottom or buffer portion 105 of the buffer/channel layer 106 may include undoped (or not intentionally doped) GaN or GaN doped with a p-type dopant such as C or Fe at a level of about $10^{17}$ to about $10^{19}$ cm-3 to render the buffer portion 105 highly resistive. In embodiments in which the bottom portion 105 is doped, the dopants may be intentionally incorporated during the first 0.1 to 1 micron of epitaxial growth. Undoped subsequent material may then be grown, albeit with the possible incorporation of doping due to "memory effects" present during growth. Alternatively, the buffer portion 105 of the buffer/channel layer 106 may include $Al_xGa_{1-x}N$ where the Al mole fraction, X, is between 0.03 and 0.06. The thickness of the buffer portion 105 may be between about 0.2 and 5 about microns. The $Al_xGa_{1-x}N$ may be doped or undoped. An upper or channel portion 107 of the buffer/channel layer 106 may be generally an undoped lower bandgap material relative to a barrier layer 108 (e.g. AlGaN), such as GaN or $In_xGa_{1-x}N$ where X is between 0 and 1. The channel portion 107 may be optimized for optimal electron transport and device speed by minimizing the amount of alloy and impurity scattering by avoiding Al-containing alloys or high levels of dopants. The channel portion 107 may have a thickness of about 0.01 to about 1 microns. The AlGaN barrier layer 108 is disposed on and adjacent to the buffer/channel layer 106, and a GaN cap layer 110 is disposed on and adjacent to the barrier layer 108. The AlGaN barrier layer 108 may have a thickness of about 30 Angstroms to about 400 Angstroms, or thicknesses in the range of about 70 Angstroms to about 250 Angstroms. The cap layer 110 defines a surface 112 of the semiconductor substrate 102, and may have a thickness of about 10 Angstroms to about 50 Angstroms. One or more of the buffer/channel, barrier, and/or cap layers 106, 108, 110 may be doped, un-doped, or unintentionally doped.

The stress-induced polarization resulting from epitaxial growth of the AlGaN and GaN layers develops a two-dimensional electron gas at the interface between the channel and barrier layers 106 and 108. The two-dimensional electron gas provides charge carriers for conduction during operation. The GaN cap layer 110 may provide protection for the channel and barrier layers 106 and 108 during subsequent processing steps and may be configured to lower gate leakage.

Other semiconductor materials may be used in the channel, barrier, and/or cap layers 106, 108, 110. In some cases, other Group III-nitride semiconductor materials are used. Such materials may include other binary, ternary, and quaternary compounds. For example, other materials such as InGaN may be used for the channel layer 106 that have a bandgap less than the bandgap of the barrier layer 108, as well as a higher electron affinity than the barrier layer 108. Also, $In_xAl_{1-x}N$, where X may but need not be selected to achieve a lattice match with the channel portion 107 of the buffer/channel layer 106, may be used for the barrier layer 108. One or more of the channel, barrier, and/or cap layers 106, 108, 110 may be a composite layer.

In other embodiments, additional semiconductor layers may be incorporated into the heterostructure arrangement. For example, buffer, nucleation, and/or transition semiconductor layers may be included in the semiconductor substrate 102. For instance, an AlN interbarrier layer may be used between the barrier layer 108 and the buffer/channel layer 106.

One or more isolation regions 114 are formed in the semiconductor substrate 102 to define an active area 116 along the surface 112 of the semiconductor substrate 102. The isolation regions 114 may be formed via an implantation procedure configured to damage the epitaxial and/or other semiconductor layers of the semiconductor substrate 102. The configuration and/or fabrication of the isolation regions 114 may vary. For example, the isolation regions 114 may be configured as isolation trenches filled with one or more dielectric materials. In alternative embodiments, the active area 116 of the transistor device 100 is defined via a mesa-etched structure supported by the base substrate 104 and configured to define the heterojunction active area. The semiconductor substrate 102 may thus include such mesa-etched and other semiconductor structures. A number of alignment marks 118 may be formed along the surface 112 outside of the active area 116.

The transistor device 100 includes a gate 120 supported by the semiconductor substrate 102 to control current flow through the buffer/channel layer 106 in the active area 116. In this example, the gate 120 is configured as a Schottky gate and is disposed on the cap layer 110. A variety of materials may be used to form the Schottky contact of the gate 120, such as one or more of nickel (Ni), platinum (Pt), nickel silicide ($NiSi_x$), copper (Cu), palladium (Pd), chromium (Cr), tungsten (W), or other suitable materials. The gate 120 may be T-shaped, with a vertically oriented stem as shown. In other embodiments, the gate may be recessed stopping in the AlGaN barrier layer or on an AlN interbarrier layer between the AlGaN barrier layer 108 and the buffer/channel layer 106.

The gate 120 is disposed between a pair of ohmic contacts 122 supported by the semiconductor substrate 102 in the active area 116. The ohmic contacts 122 are spaced from one another to define terminals (e.g., source and drain terminals) of the transistor device 100 between which current flows when the channel is formed by a suitable gate control voltage applied to the gate 120. In this example, the ohmic contacts 122 are disposed on the surface 112 of the semiconductor substrate 102 and are thus deposited on the cap layer 110. In other embodiments, the ohmic contacts 122 are formed in recesses in the semiconductor substrate 102, in which case the ohmic contacts may be deposited on, for instance, the barrier layer 108.

The transistor device 100 includes multiple dielectric layers supported by the semiconductor substrate 102 and configured for surface passivation. A first dielectric layer 124 extends across the active area 116 between the ohmic contacts 122. The dielectric layer 124 may extend beyond the active area 116 as shown. The dielectric layer 124 includes an opening 126 in which the gate 120 is disposed to establish the Schottky junction at the surface 112 of the semiconductor substrate 102. The dielectric layer 124 includes further openings 128 in which the ohmic contacts 122 are disposed.

In this example, the dielectric layer 124 includes low pressure chemical vapor deposition (LPCVD) $Si_3N_4$. Alternative or additional dielectric materials may be used in the dielectric layer 124. In some cases, a layer of $Si_3N_4$ may be deposited via a non-LPCVD procedure. Alternatively, $Si_3N_4$ may be deposited using plasma-enhanced chemical vapor deposition (PECVD), sputtering, or atomic layer deposition may be used to form the dielectric layer 124. Other materials such as silicon dioxide ($SiO_2$), silicon oxide (SiO), silicon oxy-nitride (SiON) may be used to form the dielectric layer 124 using a variety of techniques, such as LPCVD, PECVD, sputtering, or atomic layer deposition. The dielectric layer 124 may be formed in a multi-layer stack using a variety of materials and techniques, including, for instance, one or more of those referenced above.

A second dielectric layer 130 is disposed between the dielectric layer 124 and the surface 112 of the semiconductor substrate 102. The first dielectric layer 124 is spaced from the surface 112 by the second dielectric layer 130. The first dielectric layer 124 may be considered an upper or primary passivation layer, and the second dielectric layer 130 may be considered a lower or intermediary passivation layer. In this embodiment, the second dielectric layer 130 extends across the active area 116 to passivate the entire surface 112 in the active area 116, including those portions of the surface 112 over the channel layer 106. The second dielectric layer 130 extends along or covers the surface 112 with the exception of an opening 132 for the gate 120 and openings 134 for the ohmic contacts 122. The gate 120 is disposed in the openings 126 and 132 to establish a Schottky junction at the surface 112 of the semiconductor substrate 102, while each ohmic contact 122 is disposed in a respective pair of the openings 128 and 134.

The second dielectric layer 130 may be configured as an etch stop layer that also acts as a surface passivation layer. In some embodiments, the second dielectric layer 130 includes a wet etchable material having an etch selectivity to a dry etchant of the first dielectric layer 124. For example, the second dielectric layer 130 may include one or more materials with etch selectivity to fluorine- or fluoride-based and/or other RIE processes used to dry etch $Si_3N_4$. Suitable dry etchants include Tetrafluoromethane ($CF_4$), hexafluoroethane ($C_2F_6$), and Sulfur hexafluoride ($SF_6$). Depending on the etch conditions, oxygen and/or argon may be combined with the dry etchants to prevent polymer formation during the dry etch procedure. The second dielectric layer 130 may thus block the dry etchant from reaching the surface 112 of the semiconductor substrate 102 during formation of the openings 126 and 128. In one example, the second dielectric layer 130 may include aluminum oxide ($Al_2O_3$) deposited via an atomic layer deposition (ALD), CVD, or other procedures, some of which may involve temperatures of, e.g., about 200 to about 400° C. The $Al_2O_3$ layer may have a thickness that falls in range from about 3 nm to about 40 nm. In other embodiments, the second dielectric layer 130 may be deposited in-situ after (e.g., immediately after) the semiconductor substrate 102 is complete, but before the semiconductor substrate 102 is exposed to ambient conditions (e.g., outside the deposition chamber). Such deposition may be done using CVD, MBE, or MOCVD. For example, the dielectric layer 130 may include a single amorphous AlN, $HfO_2$, or $Al_2O_3$ layer. The dielectric layer may also include a multi-layer stack in which the $Al_2O_3$ or AlN layer has a SiN or $SiO_2$ layer deposited as a top layer for surface protection during processing. In these embodiments, the deposition temperature may be about 200° C. to about 800° C., however, deposition temperatures for the dielectric layer disposed on or in contact with the semiconductor substrate 102 may be less than 600° C. In one example, if the first dielectric layer 124 is selectively etched via a dry etch procedure, e.g., using fluorine- or fluoride-based plasma etchants, the $Al_2O_3$ in the second dielectric layer 130 stops the etchant at better than 50:1 etch selectivity to $Si_3N_4$.

The second dielectric layer 130 may then be etched to form the openings 132 and 134 using a wet etch procedure configured to avoid damage to the surface 112 of the semiconductor substrate 102. A number of different wet etch processes may be used. In one example, a buffered oxide etch (BOE) procedure is implemented to define the openings 132 and 134. In $Al_2O_3$ embodiments, the second dielectric layer 130 may alternatively be removed using a wet etch procedure involving diluted HF.

Additional or alternative dielectric materials may be incorporated into, or used as, the second dielectric layer 130. The additional or alternative materials may also have an etch selectivity to block an etchant of the first dielectric layer 124. One such additional or alternative dielectric material is hafnium oxide ($HfO_2$). The second dielectric layer 130 may include a mixture of $Al_2O_3$ and $HfO_2$, discrete layers of $Al_2O_3$ and $HfO_2$, or other combination arrangements. The second dielectric layer 130 is not limited to etch resistant materials. For example, the etch stop dielectric layer may include a dielectric stack including a lower or bottom layer of $SiO_2$ and an upper or top layer of $Al_2O_3$ and/or $HfO_2$. The bottom layer may be configured for compatibility with the semiconductor material (e.g., GaN) at the surface 112. The top layer may include SiN to protect the wafer during subsequent processing steps. The resistance to etchants of the material(s) in the second dielectric layer 130 may thus vary.

The second dielectric layer 130 may be configured to provide surface passivation in the active area 116. For example, use of $Al_2O_3$ in the second dielectric layer 130 provides the passivation function due to the high thermal and chemical stabilities of $Al_2O_3$.

In alternative embodiments, one or more additional dielectric layers may be disposed along the surface 112 in the active area 116. Such layer(s) may be disposed between the first and second dielectric layers 124, 130, below the first and second dielectric layers 124, 130 adjacent the surface 116, or above the first and second dielectric layers 124, 130 in contact with and above the first dielectric layer 124.

The selective etching of the first and second dielectric layers 124, 130 allows both the gate 120 and the ohmic contacts 122 to be formed in a manner that avoids damage to the surface 112 of the semiconductor substrate 102. Damage is avoided by following up the dry etching of the first dielectric layer 124 with a wet etch of the second dielectric layer 130. The wet etch of the areas for both the ohmic contacts 122 and the gate 120 may thus provide low ohmic contact resistance and low gate leakage, respectively. The wet etch for the gate area 120 may be omitted in embodiments in which the transistor device has a metal-insulator-semiconductor (MIS) gate configuration as shown and described below in connection with the embodiment depicted in FIG. 10.

The exemplary embodiment shown in FIG. 1 includes a number of other structures to facilitate connections to the gate 120 and the ohmic contacts 122. For instance, the transistor device 100 may include a patterned metal layer 136 for connections to the ohmic contacts 122. In this example, the metal layer 136 is also used to define the gate 120. A second metal layer 138 may then be defined as shown. One or more inter-layer dielectric (ILD) layers 140 may be deposited to isolate the metal layers 136, 138 and/or for device passivation. In this example, the transistor device 100 also includes a field plate 142 deposited between the ILD layers 140 to shield the gate 120 from high voltages applied to one of the ohmic contacts 122 acting as, for instance, a drain terminal of the transistor device 100.

The embodiments depicted in FIGS. 2-5 and 11 show how the etch stop layer, e.g., the second dielectric layer 130, may be patterned in further selective etching of the surface passivation layers. With such patterning, the area(s) in which surface passivation is achieved via the etch stop layer may be localized. For example, the etch stop layer may be limited to areas or portions of the active area in the vicinity of the openings for the gate and/or ohmic contacts. Other portions of the active area may thus be covered and passivated by the other dielectric layer (e.g., a $Si_3N_4$ layer). Such patterning may retain one or more of the advantages of the wet-etched dielectric layer (e.g., $Al_2O_3$) while allowing for the benefits of other surface passivation layers in areas spaced from gate and/or ohmic contact areas. For example, allowing $Si_3N_4$ to passivate the surface of the semiconductor substrate may be useful in embodiments having a Group III-nitride semiconductor material such as GaN defining the surface. The presence of LPCVD $Si_3N_4$ at the surface tends to dope the surface n-type from, e.g., nitrogen vacancies due to the sublimation of GaN, which may occur at temperatures around 675° C. Such extra n-type doping reduces the onset of current collapse in the device. Further details regarding the use of surface passivation of GaN-based transistor devices is set forth in U.S. Patent Publication No. 2007/0241419 ("Transistor and Method with Dual Layer Passivation"). Limiting the lateral extension of the etch stop dielectric beyond the gate area and/or ohmic contact areas may also be useful to the extent that, for instance, a possibility of charge buildup in $Al_2O_3$ exists. In some cases, the etch stop layer is only present between the gate and drain, as shown and described below in connection with the embodiment of FIG. 4. With no $Al_2O_3$ in the source region at all, the configuration may be useful for minimizing source resistance. Using LPCVD $Si_3N_4$ only in the source region may minimize contact resistance because LPCVD $Si_3N_4$ passivated material has lower sheet resistance than $Al_2O_3$ passivated material.

Figure 2:
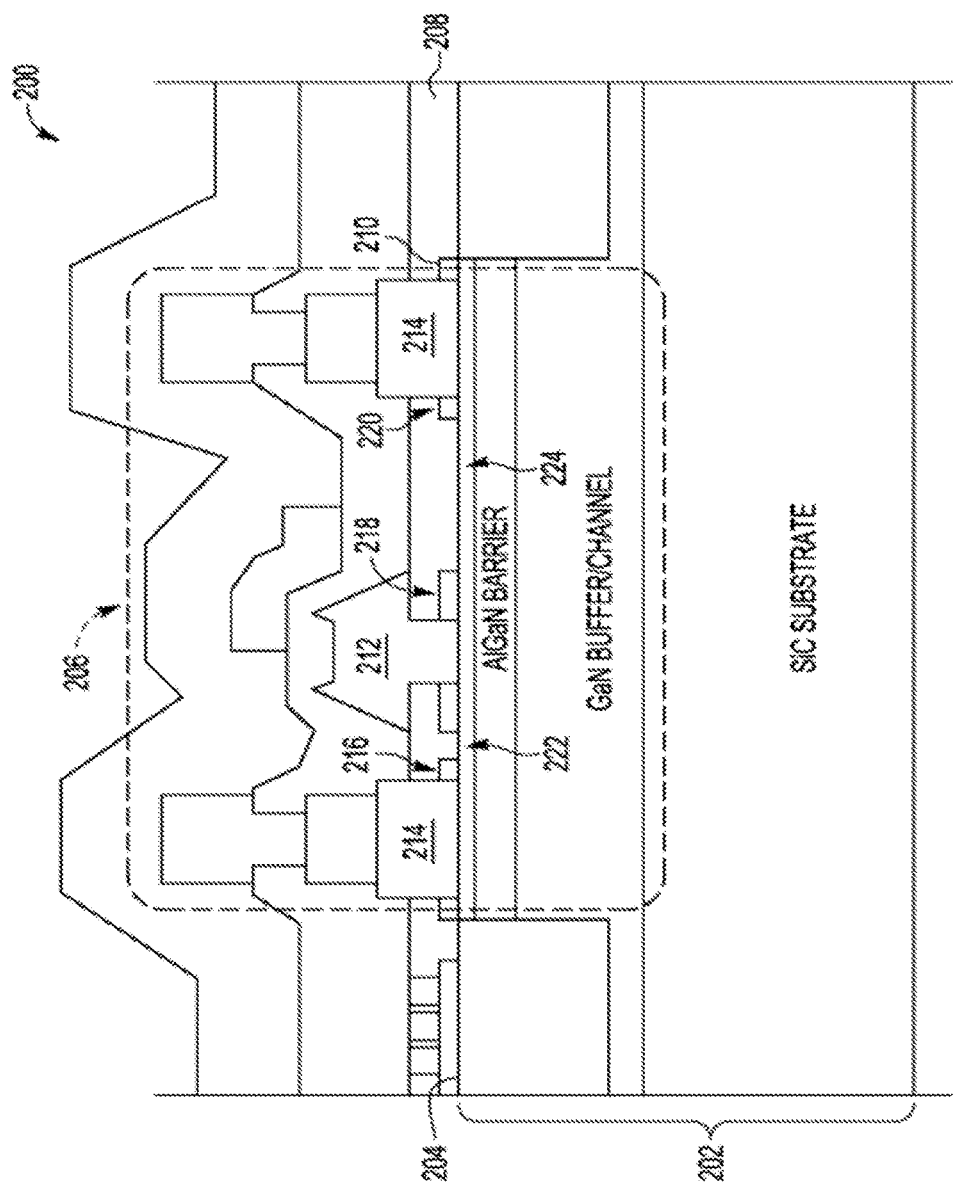
FIG. 2 is a schematic, cross-sectional view of a semiconductor device having selectively etched surface passivation layers, including a patterned surface passivation layer, in accordance with one embodiment.

FIG. 2 depicts another exemplary epitaxial GaN transistor device 200 having selectively etched dielectric layers for surface passivation. The transistor device 200 may include a semiconductor substrate 202 having epitaxial Group III-nitride semiconductor layers to define a channel, barrier layer, and cap layer, as described above. A number of other components of the transistor device 200 may be configured in a manner similar to the transistor device 100 of FIG. 1. For example, the epitaxial semiconductor layers may be grown on a similar base substrate to define a surface 204 of the semiconductor substrate 202, and isolated to define an active area 206 of the transistor device 200. The surface 204 is passivated by a dielectric layer 208 (e.g., $Si_3N_4$) and a patterned etch stop layer 210 (e.g., $Al_2O_3$). As described above, the dielectric layer 208 may be dry etched (e.g., using Fluorine-based chemistry) and the etch stop layer 210 may be wet etched to define openings for a gate 212 and ohmic contacts 214.

The patterning of the etch stop layer 210 determines which of the two dielectric layers and, thus, which dielectric material is used to passivate the surface 204 in a particular area. In this example, the etch stop layer 210 is disposed between the dielectric layer 208 and the surface 204 in areas 216, 218, and 220. Each area 216, 218, 220 corresponds with a portion of the active area 206 disposed over a channel of the transistor device 200. The areas 216, 220 may be adjacent to or abut a respective one of the ohmic contacts 214 (or the openings in which the contacts are disposed), while the area 218 may be adjacent to or abut the gate 212 (or the opening in which the gate 212 is disposed). The patterning of the etch stop layer 210 may thus limit the use of the etch stop to such areas in and around the gate 212 and the ohmic contacts 214. The remaining portion or portions of the surface 204 may be passivated by the dielectric layer 208. In this example, the dielectric layer 208 is disposed on the surface 204 in areas 222 and 224, which correspond with portions of the active area 206 over the channel between the gate 212 and the ohmic contacts 214. The areas 222 and 224 are accordingly spaced from the gate by the area 218, and from the ohmic contacts 214 by the area 216 or the area 220. The etch selectivity of the etch stop layer 210 protects the surface 204 in the openings for the gate 212 and the ohmic contacts from damage that would otherwise arise from the etchant of the dielectric layer 208.

The areas in which the etch stop layers of the disclosed devices are removed for $Si_3N_4$ or other surface passivation may vary. For example, the extent to which the etch stop layer extends beyond the area of the opening of the gate or ohmic contact may be customized, and may differ based on the device terminal. As shown in the examples described below, the etch stop layer may extend across the area between one of the ohmic contacts and the gate, while an area between the other ohmic contact and the gate is passivated by the other dielectric layer.

Figure 3:
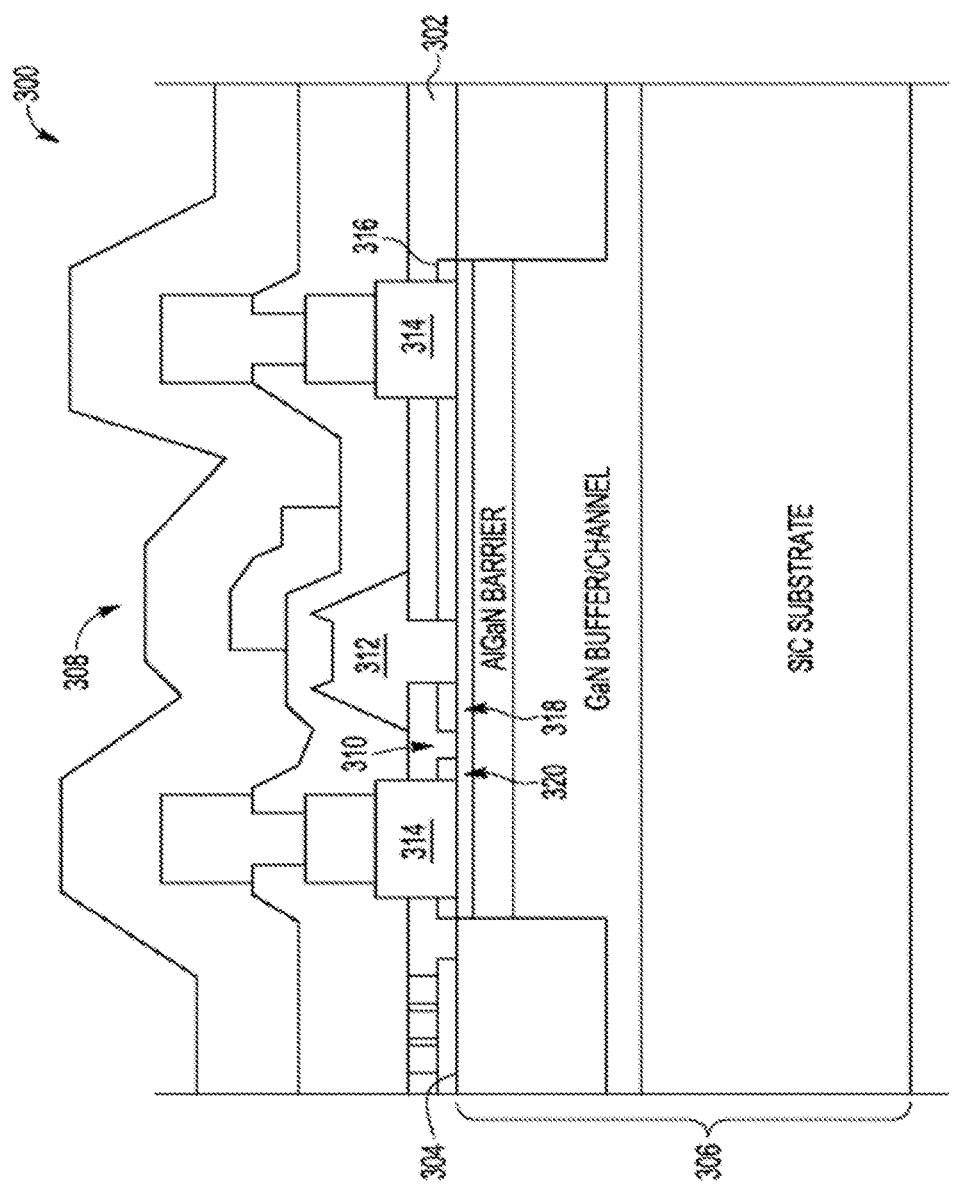
FIGS. 3-5 are schematic, cross-sectional views of semiconductor devices with a surface passivation layer patterned in accordance with various embodiments.

FIG. 3 depicts another exemplary transistor device 300 in which a dielectric layer 302 passivates a surface 304 of a semiconductor substrate 306 in a selected portion of an active area 308. The portion in this example is an area 310 between a gate 312 and one of a pair of ohmic contacts 314. To that end, an etch stop layer 316 is patterned to allow the surface 304 to be passivated by the dielectric layer 302 in the area 310. The etch stop layer 316 may include $Al_2O_3$ and the dielectric layer 302 may include $Si_3N_4$ as described above. The etch stop layer 316 may passivate the surface 304 in areas 318 and 320 in contact with or abutting the openings for the gate 312 and one of the ohmic contacts 314, respectively. The area 310 is spaced from the gate 312 and the ohmic contact 314 by the areas 318, 320, respectively. Unlike the embodiment of FIG. 2, however, the dielectric layer 302 is not disposed on or adjacent the surface 304 between the gate 312 and the other ohmic contact 314. In that area, the etch stop layer 316 passivates the surface 304.

Figure 4:
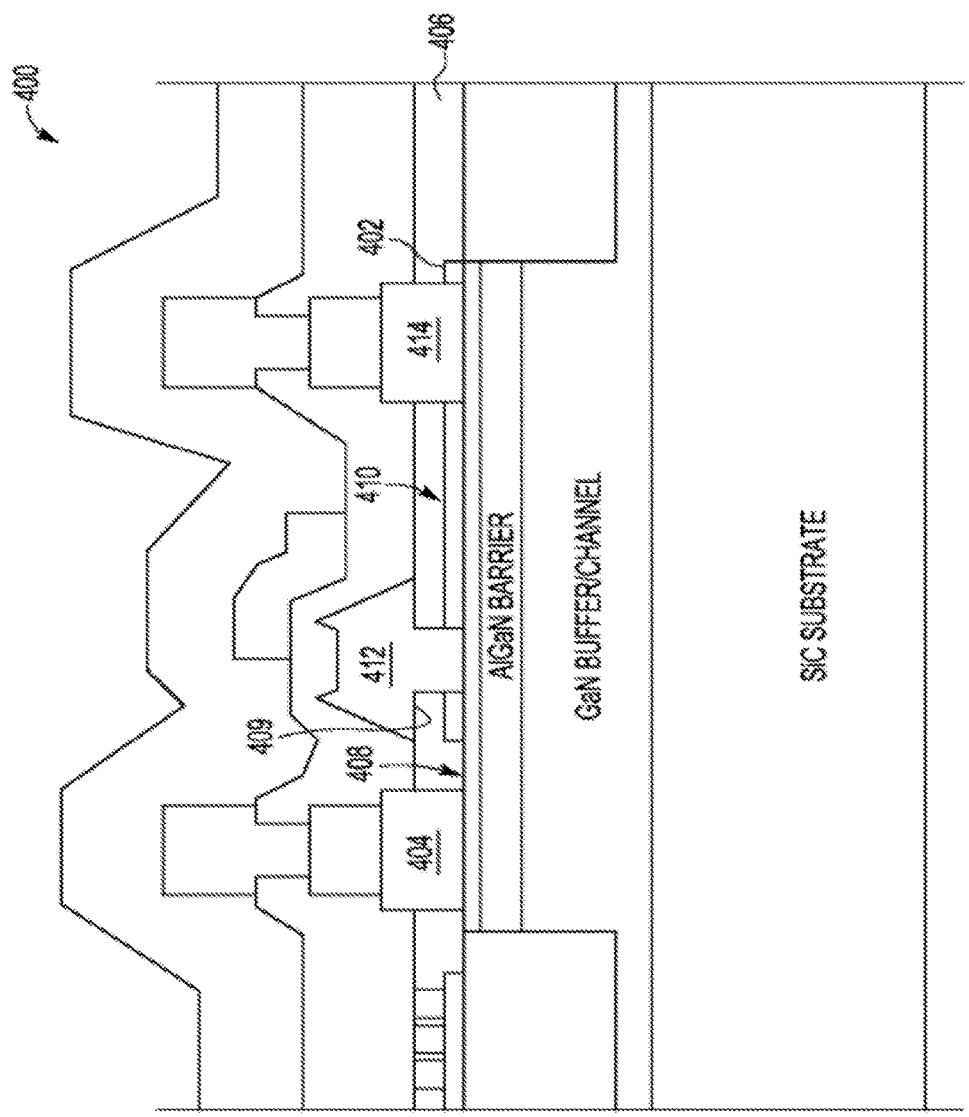
Figure 5:
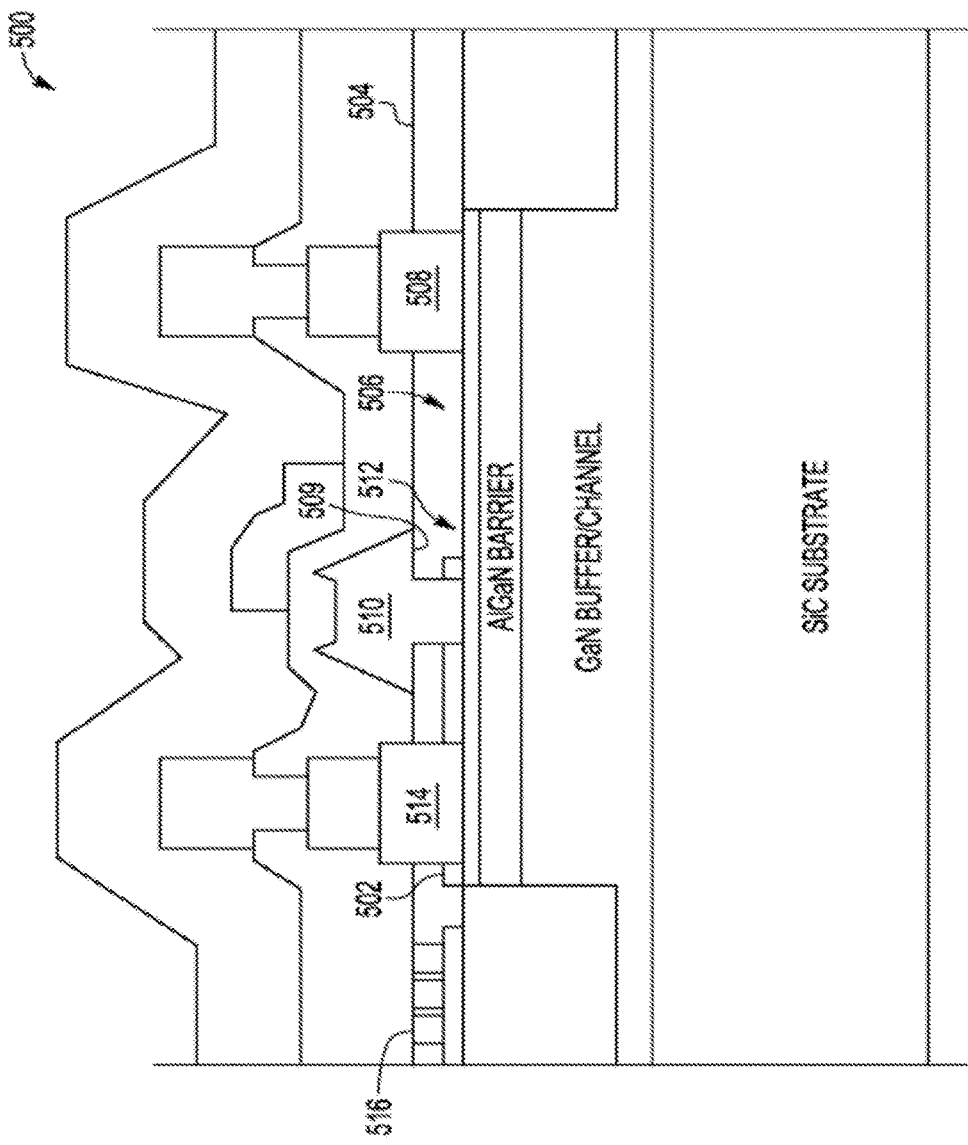
Figure 11:
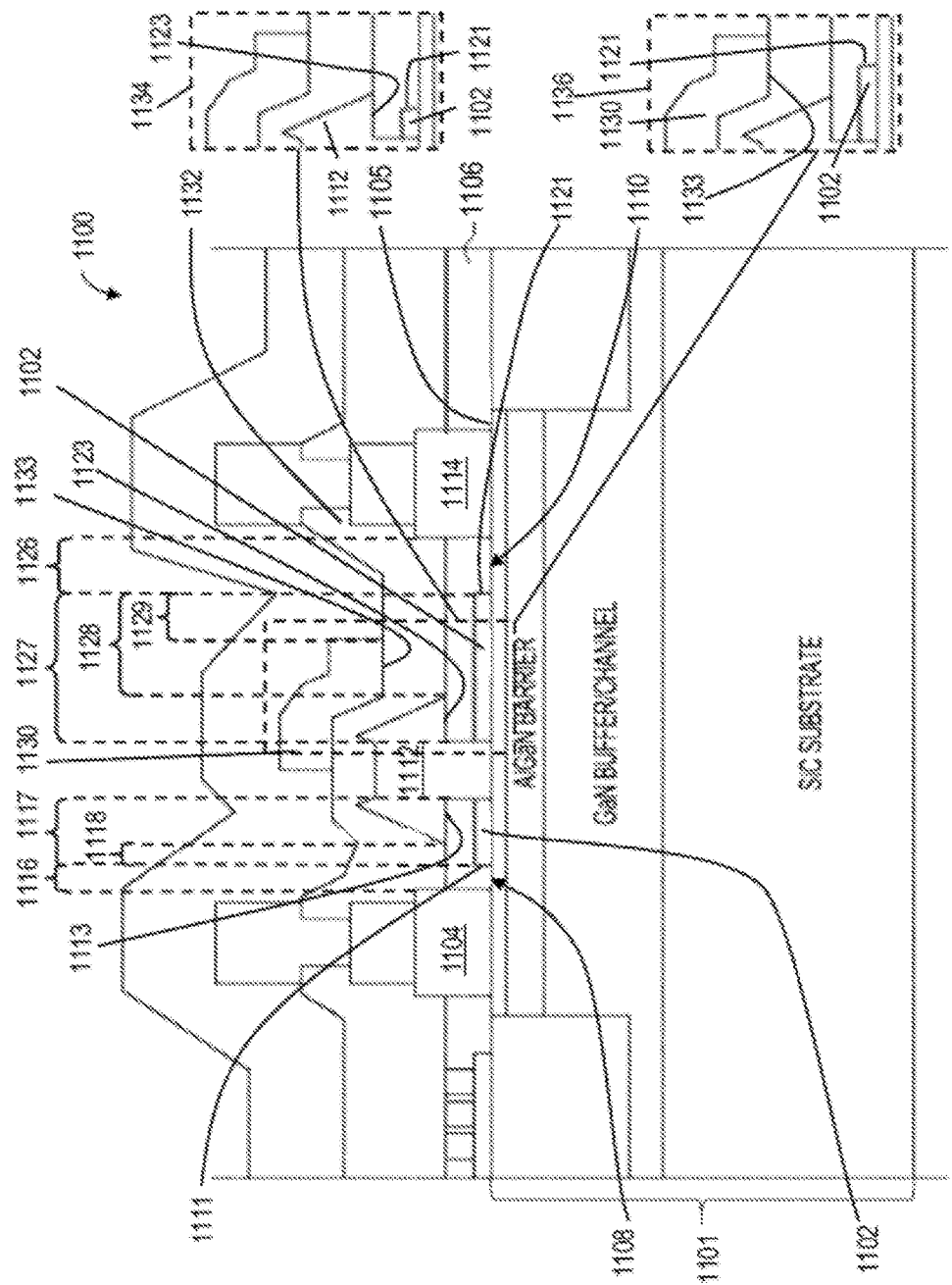
FIG. 11 is a schematic, cross-sectional view of a semiconductor device having selectively etched surface passivation layers, including a patterned surface passivation layer, in accordance with one embodiment.

FIGS. 4, 5, and 11 depict further examples of etch stop layer patterning for selective surface passivation in transistor devices 400, 500, and 1100 respectively. The examples show that the patterning of the etch stop layer is not limited to configurations in which the $Si_3N_4$ layer passivates the surface of the semiconductor substrate only in an area (or areas) spaced from and between the pair of ohmic contacts. The patterning may instead remove the etch stop dielectric from areas (or portions of the active area) abutting one or both of the areas in which the openings for the ohmic contacts are formed.

In FIG. 4, an etch stop layer 402 is patterned such that the etch stop layer 402 does not abut an ohmic contact 404, which may be configured as a source terminal of the transistor device 400. The etch stop layer 402 may be removed entirely from the area in and around the ohmic contact 404. Alternatively, the etch stop layer 402 may be patterned such that the only remaining portion corresponds with the area to be defined as the opening for the ohmic contact 404. The etch stop layer 402 may thus protect the surface in the ohmic contact area during dry etch removal of a dielectric layer 406, such as $Si_3N_4$ as described above. In either case, the etch stop layer 402 does not extend beyond the ohmic contact 404 after formation of the ohmic contact 404. Instead, the dielectric layer 406 is thus disposed on the surface in an area 408 abutting the ohmic contact 404. In contrast, the surface is covered by the etch stop layer 402 in an area 410 between a gate 412 and another ohmic contact 414 (e.g., a drain terminal of the transistor device 400). Thus, the etch stop layer 402 abuts the ohmic contact 414. The lateral extent of the etch stop layer 402 in the area 408 may vary. For example, the etch stop layer 402 may either terminate under an overhang 409 or extend past the overhang 409.

In FIG. 5, the patterning of an etch stop layer 502 allows a dielectric layer 504 to be disposed on the surface over a wider area 506. The area 506 abuts an ohmic contact 508 as in the example of FIG. 4. The ohmic contact 508 may be configured as a drain terminal of the transistor device 500 in this case. Analogous to the description of the transistor device 400 in FIG. 4, the etch stop layer 502 may be patterned to terminate under or beyond an overhang 509 in an area 512 near a gate 510. The extent to which the dielectric layer 504 passivates the surface is thus increased in an area 512 near the gate 510 (e.g., under the overhang 509). The etch stop layer 502 may still cover the portion of the active area in which the opening for another ohmic contact 514 (e.g., a source contact) is eventually formed. In the example of FIG. 5 (and any other embodiments), alignment marks 516 may be used to align the patterning of the etch stop layer with an ohmic contact opening.

In the transistor device 1100 of FIG. 11, a semiconductor substrate 1101, analogous to the semiconductor substrate 102 of FIG. 1, supports an etch stop layer 1102 (i.e., a dielectric layer) that may be patterned such that it surrounds a gate 1112 that includes a first overhang 1113 and a second overhang 1123. For example, the etch stop layer 1102 may be formed from materials such as those discussed in conjunction with the second dielectric layer 130, FIG. 1. In embodiment, the etch stop layer 1102 does not cover the portion of the active area where first and second ohmic contacts 1104 and 1114 are formed. In an embodiment, the first ohmic contact 1104 may be configured as a source terminal and the second ohmic contact 1114 may be configured as a drain terminal of the transistor device 1100. The etch stop layer 1102 may be removed entirely from a source area 1108 and a drain area 1110 adjacent the first and second ohmic contacts 1104 and 1114. The dielectric layer 1106 is disposed on the surface 1105 of the semiconductor substrate 1101 in the source and drain areas 1108 and 1110 abutting the ohmic contacts 1104 and 1114. Thus, in an embodiment, the etch stop layer 1102 abuts the gate 1112, although it does not abut the source terminal and drain terminal configured from ohmic contacts 1104 and 1114. As used herein, "abut" means to directly contact and "does not abut" means to not directly contact.

In an embodiment, the lateral extent of the etch stop layer 1102 in the source and drain areas 1108 and 1110 may vary. In an embodiment, the lateral extent of the etch stop layer 1102 in the source area 1108 may be characterized by a first ohmic distance 1116 and a first etch stop length 1117. Likewise, the lateral extent of the etch stop layer 1102 in the drain area 1110 may be characterized by a second ohmic distance 1126 and a second etch stop length 1127.

The first ohmic distance 1116, is defined as the distance from a first edge 1111 of etch stop layer 1102 to the vertical face of ohmic contact 1104 in the source area 1108. In an embodiment, the first ohmic distance 1116 may be between 0.1 micron and 1 micron. In other embodiments, the first ohmic distance 1116 may be between 0.01 micron and 5 microns. The first ohmic distance 1116 may be greater or smaller than the above given ranges, as well.

The first etch stop distance 1117 is defined as the lateral distance between the first edge 1111 of etch stop layer 1102 and the vertical edge of the gate 1112 at the point where the gate 1112 contacts the surface 1105, closest to the source area 1108. In some embodiments, the first etch stop distance 1117 may be between 0.2 to 2 microns. In other embodiments, the first etch stop distance 1117 may be between 0.1 to 5 microns while other larger or smaller first etch stop distances 1117 may be used. In an embodiment, the first etch stop distance 1117 may extend past the lateral extent of the first overhang 1113 by a first etch stop extension 1118 as shown in FIG. 11. In an embodiment, the first etch stop extension may be between 0.2 micron and 1 micron. In other embodiments, the first etch stop extension 1118 may be between 0.1 and 5 microns. The first etch stop extension 1118 may be greater or smaller than the above given ranges in other embodiments.

The second ohmic distance 1126, is defined as the distance from a second edge 1121 of etch stop layer 1102 to the vertical face of ohmic contact 1114 in the drain area 1110. In an embodiment, the second ohmic distance 1126 may be between 0.1 micron and 1 micron. In other embodiments, the second ohmic distance 1126 may be between 0.01 micron and 20 microns. The second ohmic distance 1126 may be greater or smaller than the above given ranges, as well. In an embodiment, the first ohmic distance 1116 and the second ohmic distance 1126 may vary in length and be unequal from each other. In other embodiments, the first ohmic distance and the second ohmic distance may be equal to each other.

The second etch stop distance 1127 is defined as the lateral distance between the second edge 1121 of etch stop layer 1102 and the vertical edge of the gate 1112 at the point where the gate 1112 contacts the surface 1105, closest to the drain area 1110. In some embodiments, the second etch stop distance 1127 may be between 0.2 to 3 microns. In other embodiments, the second etch stop distance 1127 may be between 0.1 to 20 microns while other larger or smaller second etch stop distances 1127 may be used. In an embodiment, the second edge 1121 may extend past the lateral extent of the second overhang 1123 by a second etch stop extension 1128 as shown in FIG. 11. In an embodiment, the second etch stop extension 1128 may be between 0.2 micron and 2 microns. In other embodiments, the second etch stop extension 1128 may be between 0.1 and 20 microns. Other longer or shorter values of etch stop extension 1128 may be used in other embodiments.

In an embodiment, a field plate 1130 may be disposed adjacent the gate 1112, and electrically isolated from gate 1112 by ILD layers 1132, analogous to the field plate 142 of FIG. 1. In an embodiment, the second edge 1121 of etch stop layer 1102 may extend past an overhang 1133 of the field plate 1130 by a third etch stop extension 1129. In an embodiment, the third etch stop extension may be between 0.1 and 3 microns. In other embodiments, the third etch stop extension may be between 0.01 and 20 microns though other suitable values may be used.

In other embodiments, and as shown in the view 1134 of FIG. 11, the second edge 1121 of etch stop layer 1102 in the drain area 1110 may terminate underneath or at the lateral extent of the second overhang 1123 of gate 1112. Likewise, in still other embodiments, and as shown in the view 1136 of FIG. 11, the second edge 1121 of etch stop layer 1102 in the drain area 1110 may terminate underneath or at the lateral extent of the overhang 1133 of field plate 1130.

The structure, materials, positioning, and other characteristics of a number of the above-referenced components may vary from the examples shown. For example, the gates of the above-described devices may be fabricated using a T-gate process where the gate metal only touches or abuts the $Si_3N_4$ (or other upper or top) dielectric layer along a stem of the gate (or other sidewall or vertical face thereof).

Figure 6:
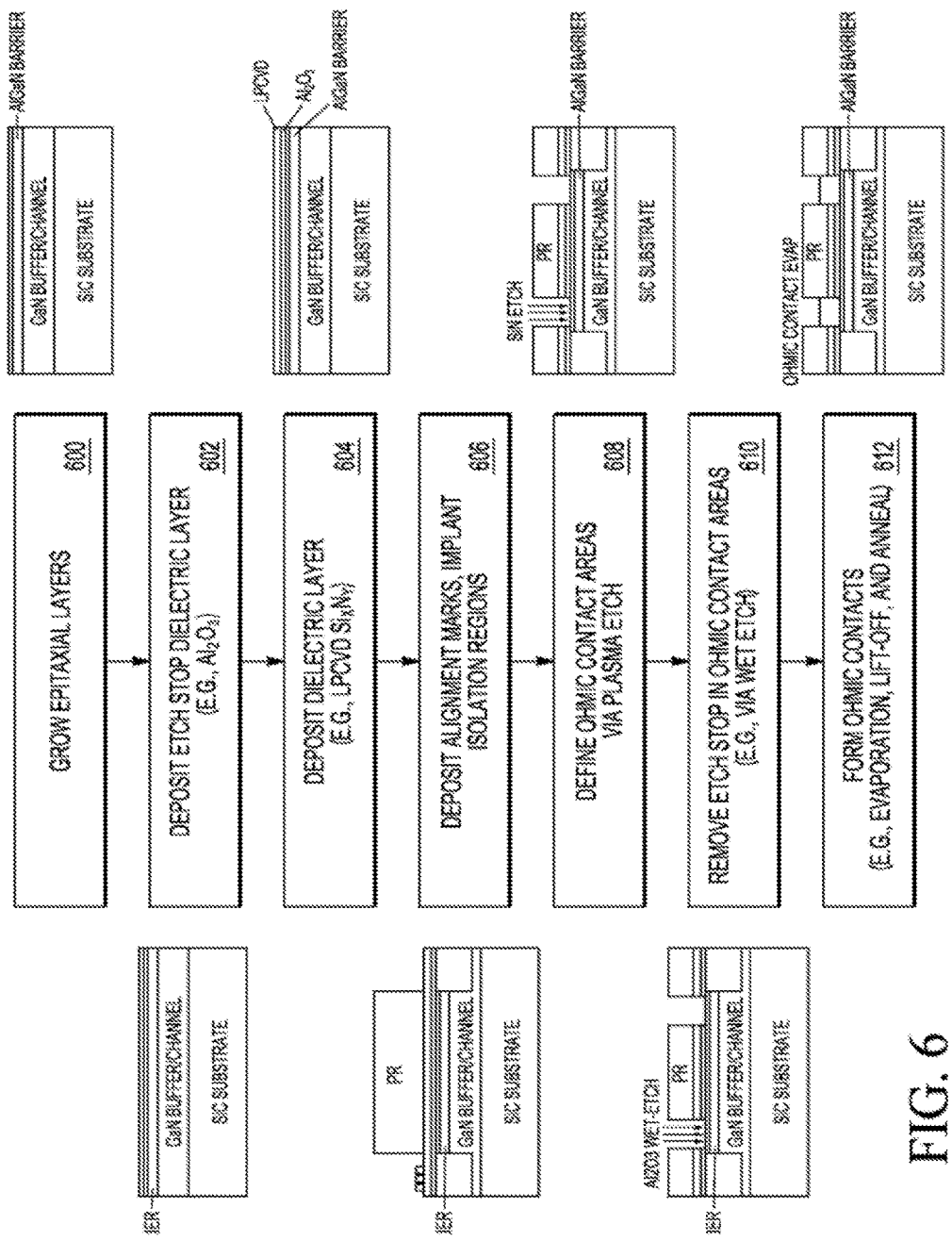
FIGS. 6-8 are flow diagrams and corresponding schematic, cross-sectional views illustrating an exemplary method of fabricating a semiconductor device involving selective etching of surface passivation layers in accordance with one embodiment.
Figure 7:
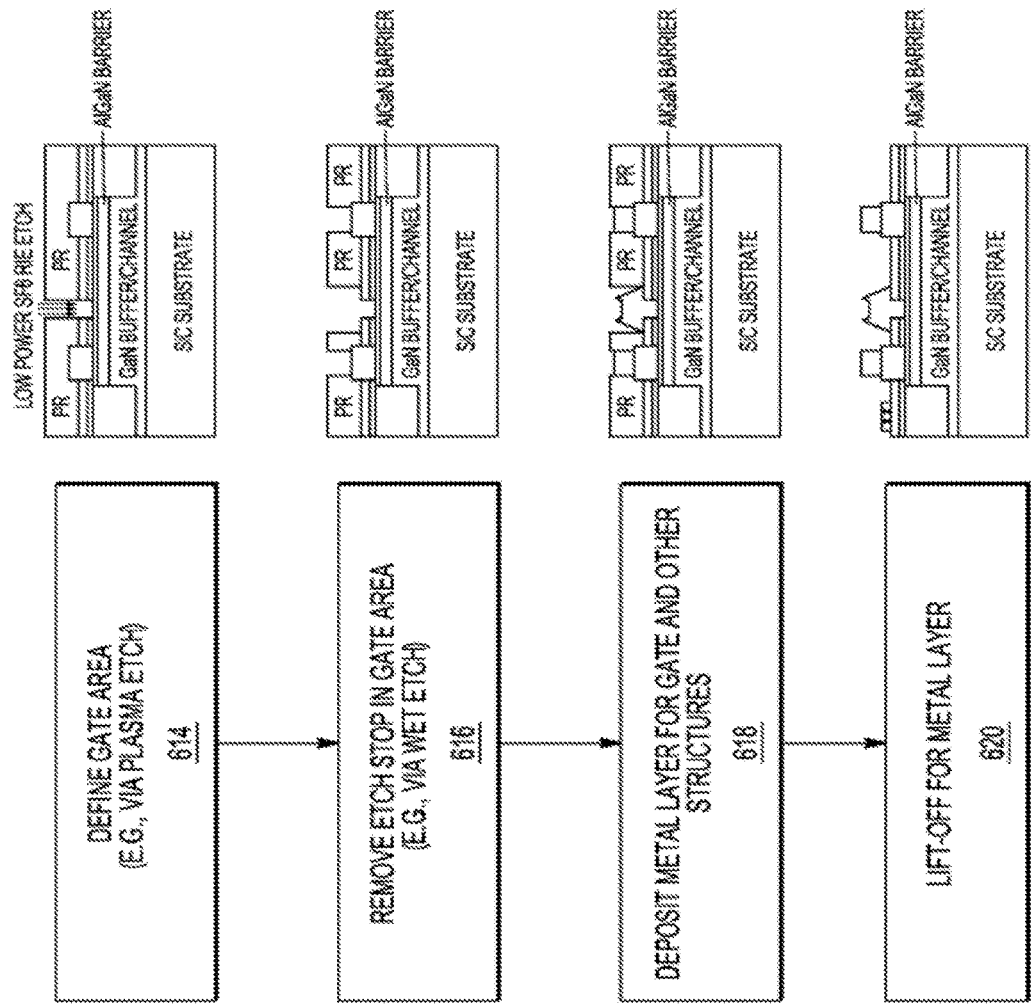
Figure 8:
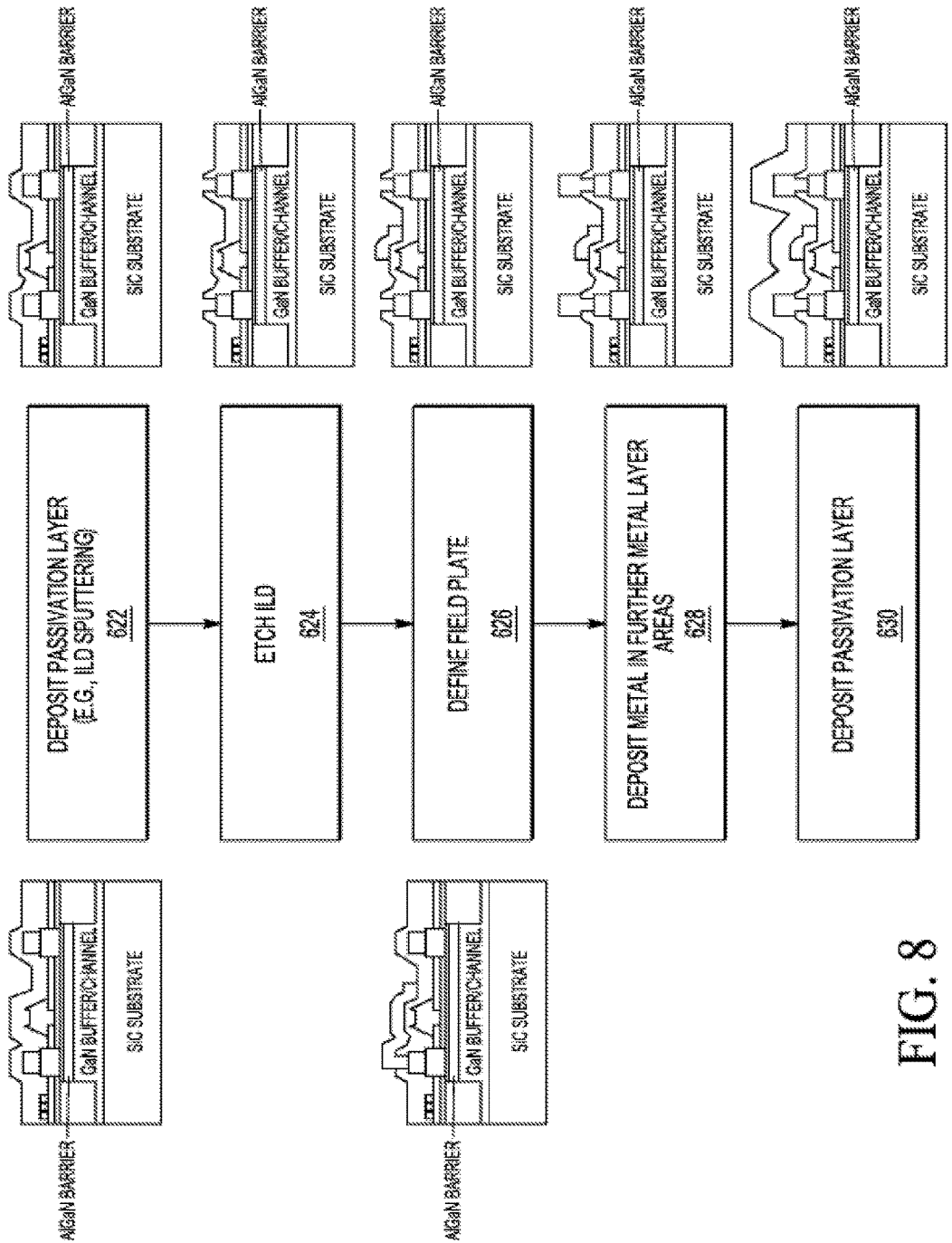

FIGS. 6-8 show an exemplary method of device fabrication involving selectively etched surface passivation in accordance with one embodiment. As described above, the device fabrication method may address a number of challenges for HFET or HEMT devices, including gate leakage and/or ohmic contact resistance. The method includes a sequence of acts, only the salient of which are depicted for convenience in illustration. For example, the method may include a number of acts directed to preparing a base substrate for the assembly method. The ordering of the acts may vary in other embodiments. For example, an isolation implant procedure may be implemented after the annealing of the ohmic contacts.

The method may begin with an act 600 in which a number of epitaxial semiconductor layers are grown on a base substrate (e.g., silicon carbide (SiC) or Si). The epitaxial semiconductor layers may be grown via one or more techniques, including, for instance, molecular beam epitaxy (MBE), metal-organic chemical vapor deposition (MOCVD), and hydride vapor phase epitaxy (HVPE). The growth of the epitaxial semiconductor layers includes defining a channel of the semiconductor device in a semiconductor substrate. In this example, the channel is defined by growing a GaN or other epitaxial Group III-nitride semiconductor layer on the base substrate. One or more additional epitaxial Group III-nitride semiconductor layers may be grown on the GaN channel layer to define, for instance, a barrier layer and a cap layer. With the growth of these and/or other semiconductor layers, the surface of the semiconductor substrate is defined for an active area of the semiconductor device. One or more of the channel, barrier, and/or cap layers may be deposited via non-epitaxial techniques.

Passivation of the surface begins with the deposition of an etch stop dielectric layer on the surface across the active area in act 602. The etch stop dielectric layer may include $Al_2O_3$. In one example, the surface (e.g., a GaN surface) is covered with a layer of $Al_2O_3$ having a thickness of about 3 nm to about 40 nm, or a thickness in the range of about 10 nm to about 30 nm. The act 602 may include the deposition of alternative etch stop materials ($HfO_2$) and/or additional dielectric materials ($SiO_2$). For example, the etch stop dielectric layer may include a dielectric stack including a lower or bottom layer of $SiO_2$ or other wet-etchable dielectric film and an upper or top layer of $Al_2O_3$ and/or $HfO_2$. The deposition of the etch stop dielectric layer(s) may be implemented via atomic layer deposition (ALD), PECVD, sputtering, evaporation, LPCVD, electron-cyclotron resonance (ECR) deposition, inductively coupled plasma (ICP), hot-wire CVD (HWCVD), catalytic CVD (CAT-CVD), MOCVD, MBE, HVPE, or other suitable procedure including deposition of these materials in-situ after (e.g., immediately after) epitaxial layer growth as in act 600, but before exposure to ambient conditions.

In act 604, the surface passivation continues with the deposition of a passivation layer on the etch stop dielectric layer. The passivation layer may include $Si_3N_4$ deposited via a LPCVD procedure. The passivation layer extends across the active area over the channel. In some embodiments, the $Si_3N_4$ is deposited via a technique other than an LPCVD procedure or may include more than one layer deposited by one or more techniques. For example, atomic layer deposition (ALD), PECVD, sputtering, evaporation, LPCVD, electron-cyclotron resonance (ECR) deposition, inductively coupled plasma (ICP), hot-wire CVD (HWCVD), catalytic CVD (CAT-CVD), MOCVD, MBE, HVPE or other suitable procedures including deposition of these materials may be used. In addition, surface passivation act 604 may take place after (e.g., immediately after) act 602 in the same deposition tool, but before exposure to ambient conditions. Materials including the epitaxial semiconductor layers, etch stop layers, and passivation layers deposited during acts 600, 602, and 604 may be deposited in-situ in the same or separate chambers of one tool without exposing the semiconductor substrate to ambient conditions.

The LPCVD procedure may be configured to avoid crystallization of the etch stop dielectric layer. For example, the etch stop layer may begin to crystallize at about 800° C. for $Al_2O_3$. Unfortunately, the quality of LPCVD $Si_3N_4$ may begin to degrade at about that temperature, with significant decreases in quality possible by about 700° C. The LPCVD procedure may thus be implemented at a temperature between about 700° C. and about 800° C. In some embodiments, the LPCVD temperature is about 750° C.

The active area is defined in act 606 via patterning of a photoresist layer and implantation of isolation regions. A number of alignment marks may be deposited outside of the active area before the implantation. The alignment marks may be formed using Si, Titanium-Platinum or other combination or material that provides suitable optical contrast or electron diffraction for e-beam alignment and withstands high-temperature anneals. The alignment marks are schematically shown, such that the positioning of the alignment marks is not necessarily above or otherwise aligned with the isolation region. After the isolation implant and alignment mark deposition, the photoresist may then be removed.

In act 608, ohmic contact areas may be defined by dry etching the LPCVD $Si_3N_4$ of the passivation layer. In preparation for the dry etch or RIE procedure, a layer of photoresist is applied and patterned as shown. Various plasma etchants may then be used to remove the passivation layer, including, for instance, Fluorine-based etchants, such as $SF_6$, $CF_4$, etc. In some cases, the etch procedure forms aluminum fluoride (AlF) on the surface of the $Al_2O_3$ layer, thereby stopping the SiN etch. The dry etch procedure may be implemented at a sufficiently low power level (e.g., corresponding with about 30 to about 100 Volts DC bias) to avoid remote damage to the underlying layers (e.g., by passing through the $Al_2O_3$ etch stop layer).

Once the openings in the LPCVD $Si_3N_4$ of the passivation layer are formed, the etch stop dielectric layer may be removed in the ohmic contact areas via a wet etch procedure in act 610. Various wet etchants may be used, including, for instance, hydrofluoric acid (HF), BOE, and hot hydrochloric acid (HCl). One or more etchants may be used in connection with embodiments having a dielectric stack beneath the LPCVD $Si_3N_4$ layer. In addition, the ohmic contacts may be recessed using Cl-based chemistry such as $Cl_2$, $BCl_3$, $SiCl_4$ or other suitable dry or wet chemistry that etches Group III-V nitrides.

In act 612, the ohmic contacts are formed in the ohmic contact areas. One or more ohmic contact metals and/or other materials are deposited in the opening via evaporation, sputtering, or other procedures. For example, the procedure may include evaporating silicon to cover the surface of the semiconductor substrate in the contact area before one or more metals may be evaporated (e.g., titanium and aluminum), thereby forming a silicide at the interface. Once the metal layers are deposited, a lift-off is implemented to remove the photoresist and metals from outside of the ohmic contact areas. Formation of the ohmic contacts may then include the implementation of an anneal procedure. In one embodiment, the ohmic metal layers are annealed at less than 825° C. In another embodiment, the ohmic metal layers are annealed at less than 800° C. In still other embodiments, the ohmic metal layers are annealed at less than 750° C. The anneal time is optimized to reduce ohmic contact resistance and may last between about 30 and about 90 seconds, although shorter or longer times may be used.

The configuration, materials, and other characteristics of the ohmic contacts may be selected to allow the anneal temperature to stay below the crystallization temperature of the etch stop dielectric layer. Implementing the anneal procedure at an anneal temperature lower than 800° C. may avoid such crystallization and thus the creation of leakage paths. In some cases, the quality of the etch stop dielectric material may begin to degrade at about 800° C. The annealing temperature may thus be set between about 700° C. and about 800° C., a range in which low-temperature ohmic contact configurations remain available. In some embodiments, the anneal temperature is about 750° C. to match the temperature of the LPCVD procedure described above. For instance, the formation of the ohmic contact may include creating a recess in the semiconductor substrate before the evaporation of ohmic contact materials. Alternative or additional materials may be used, including the evaporation of Silicon tetrachloride into a recess, or the evaporation of Tantalum as a first metal layer instead of Titanium.

FIG. 7 shows a number of acts directed to form a gate of the device. A gate area is defined in act 614 by patterning a photoresist layer and dry etching the $Si_3N_4$ passivation layer. The RIE procedure may define the stem of the gate. Any one of the plasma etchants referenced above may be used, such that the etch is again stopped by the $Al_2O_3$ layer. In some embodiments, the etch stop dielectric layer may then be removed in the gate area in act 616 via a wet etch procedure using one of the wet etchants referenced above. In other embodiments, the etch stop dielectric layer is not removed (see, e.g., the embodiment of FIG. 10). In such cases, a separate cleaning procedure, e.g., using dilute HCl at room temperature or other cleaning compound that minimally etches the $Al_2O_3$ layer, may be used to clean the device surface prior to gate metal deposition. A gate contact is then formed in act 618 in the gate area to form either a Schottky gate or a metal-insulator gate. One or more gate metal layers may be deposited via evaporation, sputtering, or other techniques. In one embodiment, the gate metals include Nickel (Ni) and Gold (Au), with an optional Palladium (Pd) layer deposited on the Ni—Au structure. The gate metal layer(s) may also be deposited on the ohmic contact structures as shown. A metal lift-off procedure is then implemented in act 620 to remove the photoresist layer.

FIG. 8 shows a number of acts directed to completing the fabrication of the device. Multiple cross-sections are depicted for a number of the acts. In act 622, a first device passivation layer is deposited via, for instance, a SiN sputtering procedure. Other procedures may be used, including, for instance, PECVD, ICP, ECR-based deposition techniques. A field plate is defined via deposition of a metal layer in act 624. The first device passivation layer is etched in act 626 to define further metal layer areas. A metal layer is deposited in act 628 and a second device passivation layer is deposited in act 630.

Figure 9:
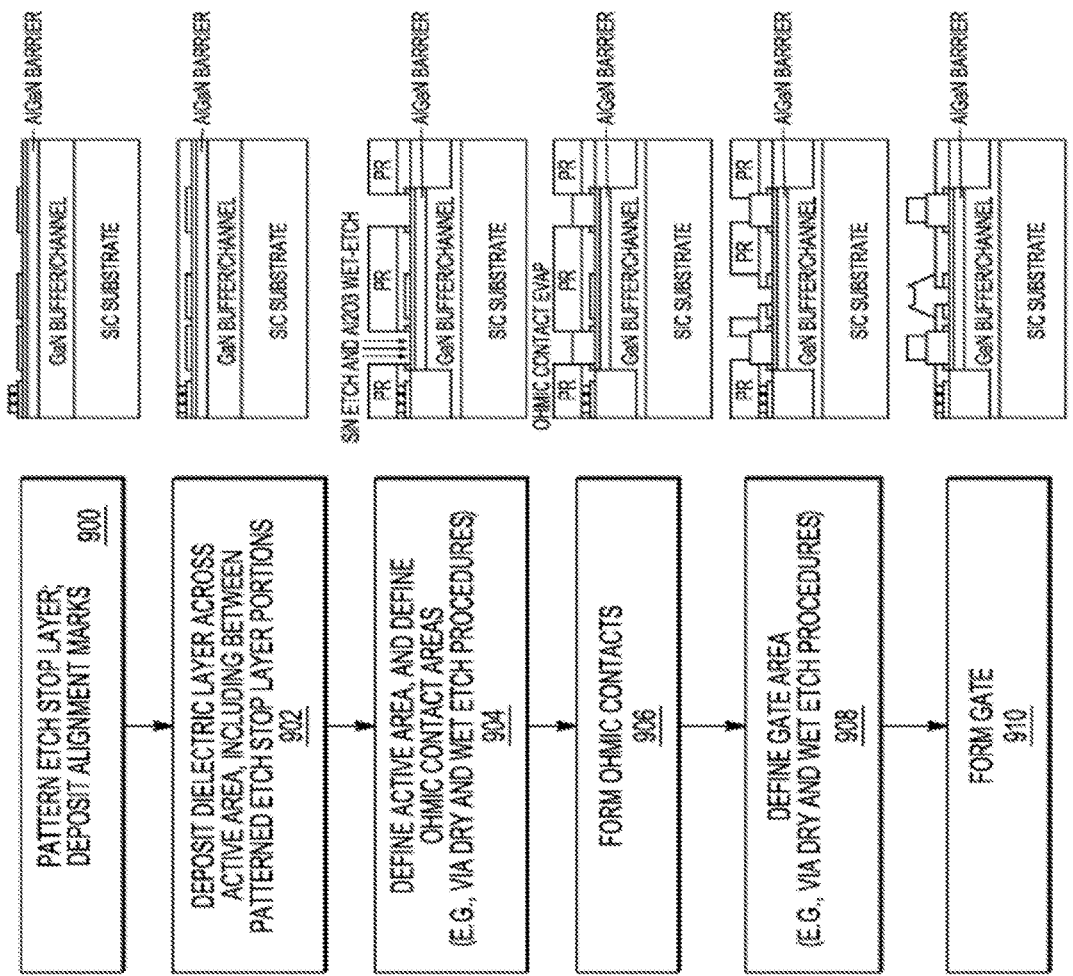
FIG. 9 is a flow diagram and corresponding schematic, cross-sectional view illustrating an exemplary method of fabricating a semiconductor device involving selective etching of surface passivation layers in accordance with another embodiment.

FIG. 9 shows an exemplary method of device fabrication in accordance with an embodiment in which the etch stop dielectric layer is patterned after being deposited on the surface of the semiconductor substrate, as shown in connection with act 900. The etch stop dielectric layer is patterned in the active area to expose one or more portions of the active area in which another dielectric layer, e.g., a $Si_3N_4$ layer, is used to passivate the surface. The one or more portions of the active area are disposed over the channel of the device, e.g., between the gate and one or both of the ohmic contacts, as described above.

A passivation layer including, for instance, $Si_3N_4$, is then deposited across the active area in act 902. The passivation layer is disposed on the remaining portions of the etch stop dielectric layer in some areas and between such portions on the surface of the semiconductor substrate in the exposed areas. A number of procedures may implemented as part of act 904, including the definition of alignment marks and the active area using an implant isolation procedure as described above. The ohmic contact areas may be defined and opened via dry and wet etch procedures as described above. In the example shown, both of the ohmic contact openings fall within one of the patterned etch stop layers. Other embodiments may have etch stop patterns that correspond or are aligned with the openings, and/or have one or more openings be defined without any etch stop present. The ohmic contacts are then formed in act 906, and may include one or more procedures configured to prevent the crystallization of the etch stop layer as described above.

The process may then continue with the definition of the gate area in act 908 via photoresist patterning and corresponding dry and wet etch procedures to remove the $Si_3N_4$ layer and the etch stop layer, respectively. A gate contact may then be formed in the gate area in act 910. In this example, the gate contact is a Schottky contact. In an alternative embodiment, the etch stop layer is not removed before the gate contact is formed. The process may include a number of other acts similar to those described above in connection with the previous embodiment to complete the device fabrication.

Figure 10:
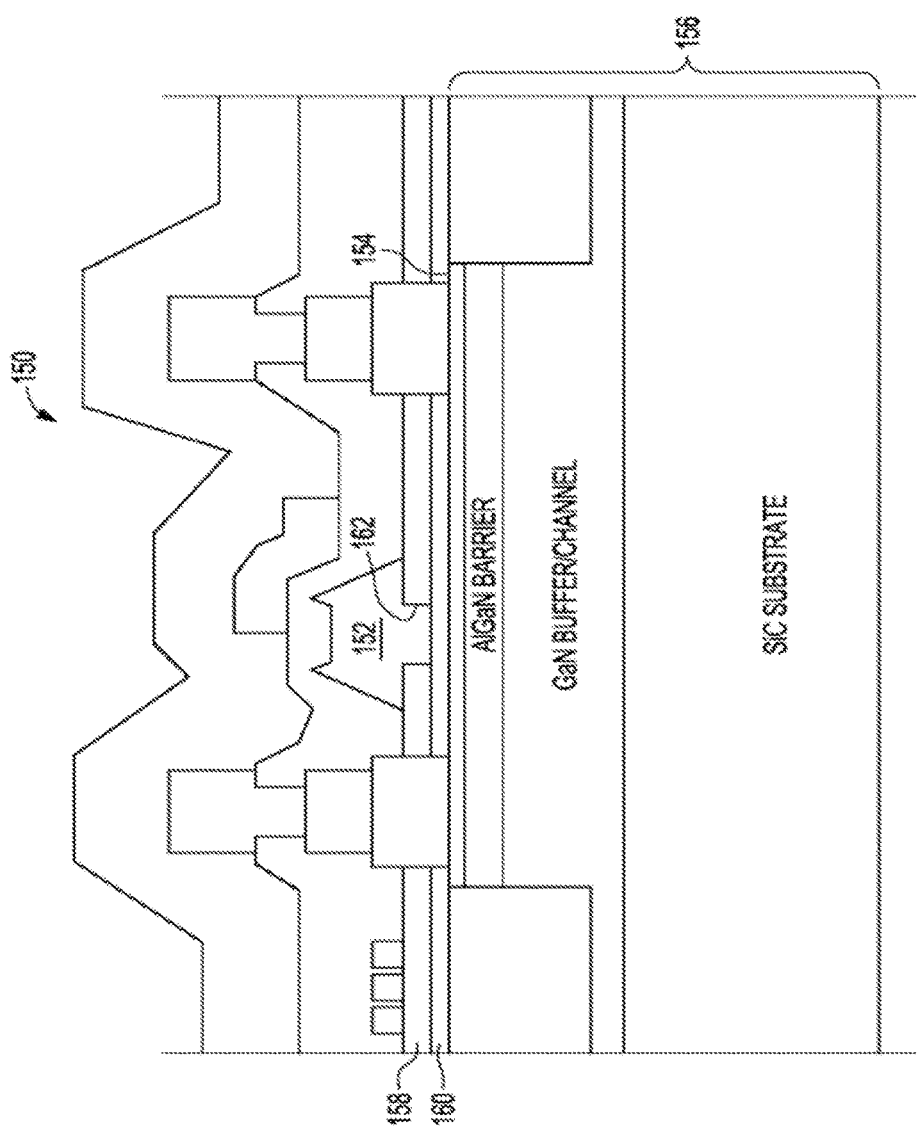
FIG. 10 is a schematic, cross-sectional view of a semiconductor device having selectively etched surface passivation layers without wet-etching of the surface passivation layer in contact with a semiconductor substrate in accordance with one embodiment.

FIG. 10 depicts a transistor device 150 having a gate 152 disposed in a metal-insulator gate configuration at a surface 154 of a semiconductor substrate 156. The transistor device 150 may thus be configured as a MISFET device. The transistor device 150 may have a number of components and structures in common with the embodiment shown in FIG. 1. For instance, the transistor device 150 includes first and second dielectric layers 158 and 160 as selectively etched surface passivation layers. The first and second dielectric layers 158 and 160 may be configured as described above. In this embodiment, only the first dielectric layer 158 has an opening 162 in which the gate 152 is disposed. The second dielectric layer 160 is disposed between the gate 152 and the surface 154 to establish the metal-insulator configuration.

The configuration of the MISFET device may vary from the example shown in FIG. 10. For example, the second dielectric layer 160 may be patterned to allow the first dielectric layer 158 to passivate the surface 154 in one or more portions of the active area.

Embodiments of a semiconductor device have been disclosed in the foregoing. In an embodiment, the semiconductor device may include a semiconductor substrate that includes a base substrate and a semiconductor layer supported by the base substrate and configured as a channel. According to an embodiment, first and second ohmic contacts may be supported by the semiconductor substrate and spaced from one another for current flow between the first and second ohmic contacts through the channel. A first dielectric layer may be supported by the semiconductor substrate, according to an embodiment. The first dielectric layer may include a first opening in which the first ohmic contact is disposed and a second opening in which the second ohmic contact is disposed. In an embodiment, a second dielectric layer may be disposed between the first dielectric layer and a surface of the semiconductor substrate. The second dielectric layer may be patterned with a first ohmic distance between a first edge of the second dielectric layer and the first ohmic contact and a second ohmic distance between a second edge of the second dielectric layer and the second ohmic contact. The second dielectric layer may include a wet etchable material having an etch selectivity to a dry etchant of the first dielectric layer, according to an embodiment.

In some embodiments, the second dielectric layer may be patterned such that the first ohmic distance and the second ohmic distance are unequal to each other. In an embodiment, a gate supported by the semiconductor substrate may be disposed between the first and second ohmic contacts and may be configured to control the current between the first and second ohmic contacts. In some embodiments, the second dielectric layer may abut the gate under first and second overhangs of the gate and may be patterned such that a second edge of the second dielectric layer extends beyond the second overhang of the gate. In other embodiments, the second dielectric layer may abut the gate under first and second overhangs of the gate and may be patterned such that a second edge of the second dielectric layer terminates under a second overhang of the gate. In an embodiment, a field plate may be disposed over the semiconductor substrate and adjacent to the gate and include a field plate overhang. In some embodiments, the second edge of the second dielectric layer may extend beyond the field plate overhang. In other embodiments, the second edge of the second dielectric layer may terminate under the field plate overhang. In an embodiment, the semiconductor layer may include a Group III-nitride semiconductor material. The first dielectric layer may include LPCVD silicon nitride, according to an embodiment. In an embodiment, the second dielectric layer may include aluminum oxide. The semiconductor substrate may include a barrier layer adjacent the semiconductor layer to create a channel, according to an embodiment.

An embodiment of the inventive subject matter may include a heterostructure field effect transistor (HFET). In an embodiment, a semiconductor substrate may include a base substrate, a Group III nitride semiconductor epitaxial layer supported by the base substrate and configured as a channel, and at least one isolation region defining an active area along a surface of the semiconductor substrate. In an embodiment, first and second ohmic contacts may be supported by the semiconductor substrate in the active area for current flow through the channel. A gate may be supported by the semiconductor substrate in the active area to control the current flow through the channel, according to an embodiment. In an embodiment, a first dielectric layer may be supported by the semiconductor substrate and extend across the active area. A second dielectric layer may be supported by the semiconductor substrate in the active area and disposed between the first dielectric layer and a surface of the semiconductor substrate, according to an embodiment. In an embodiment, the second dielectric layer may be patterned with a first ohmic distance between a first edge of the second dielectric layer and the first ohmic contact and a second ohmic distance between a second edge of the second dielectric layer and the second ohmic contact such that the first ohmic distance and the second ohmic distance are unequal. The first and second dielectric layers dielectric layer may include respective openings in which the ohmic contact is disposed, according to an embodiment. In an embodiment, the second dielectric layer may include a wet etchable material having an etch selectivity to a dry etchant of the first dielectric layer.

Further embodiments of the inventive subject matter includes methods of fabricating a semiconductor device. In an embodiment, the method may include defining a channel in a semiconductor substrate of the semiconductor device and an active area of the semiconductor device along a surface of the semiconductor substrate. The method may include depositing a wet-etchable etch stop dielectric layer on the surface in the active area and patterning the etch stop dielectric layer, according to an embodiment. In an embodiment, the method may include depositing a passivation layer on the etch stop dielectric layer defining an ohmic contact area by dry etching the passivation layer. The method may also include removing the etch stop dielectric layer in the ohmic contact area via a wet etch, according to an embodiment. In an embodiment, the method may include forming an ohmic contact in the ohmic contact area.

In an embodiment of the method, forming the ohmic contact may include implementing an anneal procedure at an anneal temperature lower than a crystallization temperature of the etch stop dielectric layer. According to an embodiment of the method, patterning the etch stop dielectric layer may include creating a first area having a first distance between the first etch stop edge and a first ohmic contact and creating a second area having a second distance between the second etch stop edge and a second ohmic contact. In an embodiment, the method may include defining a gate area by dry etching the passivation layer, wet etching the etch stop dielectric layer, and forming a gate in the gate area. In an embodiment of the method, defining the channel may include growing first and second epitaxial Group III-nitride semiconductor layers on a base substrate to define the channel and the surface of the semiconductor substrate, respectively. In embodiment of the method, the first dielectric layer may include LPCVD silicon nitride. In an embodiment of the method, the second dielectric layer may include aluminum oxide. In in embodiment of the method, depositing the passivation layer may include implementing a low pressure chemical vapor deposition (LPCVD) at an LPCVD temperature below the crystallization temperature of the etch stop dielectric layer. In an embodiment of the method, the LPCVD temperature may be between about 700° C. and about 800° C.

What is claimed is:

1. A semiconductor device comprising:
   a semiconductor substrate comprising a base substrate and a semiconductor layer supported by the base substrate and configured as a channel, and at least one isolation region defining an active area along a surface of the semiconductor substrate;
   first and second ohmic contacts supported by the semiconductor substrate and spaced from one another for current flow between the first and second ohmic contacts through the channel; and
   a first dielectric layer supported by the semiconductor substrate and comprising a respective first opening in which the first ohmic contact is disposed and a respective second opening in which the second ohmic contact is disposed;
   a second dielectric layer disposed between the first dielectric layer and a surface of the semiconductor substrate, wherein the second dielectric layer is patterned with a first ohmic distance between a first edge of the second dielectric layer and the first ohmic contact and a second ohmic distance between a second edge of the second dielectric layer and the second ohmic contact, and wherein, within the active area, the second dielectric layer is only disposed between the first ohmic contact and the second ohmic contact;
   wherein the second dielectric layer comprises a wet etchable material having an etch selectivity to a dry etchant of the first dielectric layer.

2. The semiconductor device of claim 1, wherein the second dielectric layer is patterned such that the first ohmic distance and the second ohmic distance are unequal, and wherein the second ohmic distance exceeds the first ohmic distance by a factor of at least 1.5.

3. The semiconductor device of claim 1, wherein a gate supported by the semiconductor substrate is disposed between the first and second ohmic contacts and is configured to control the current between the first and second ohmic contacts.

4. The semiconductor device of claim 3, wherein the second dielectric layer abuts the gate under first and second overhangs of the gate and is patterned such that the second edge of the second dielectric layer extends beyond the second overhang of the gate.

5. The semiconductor device of claim 3, wherein the second dielectric layer abuts the gate under first and second overhangs of the gate and is patterned such that the second edge of the second dielectric layer terminates under a second overhang of the gate.

6. The semiconductor device of claim 3, further comprising a field plate disposed over the semiconductor substrate and adjacent to the gate wherein the field plate includes a field plate overhang.

7. The semiconductor device of claim 6, wherein the second edge of the second dielectric layer extends beyond the field plate overhang.

8. The semiconductor device of claim 6, wherein the second edge of the second dielectric layer terminates under the field plate overhang.

9. The semiconductor device of claim 3, wherein the gate is disposed in a first gate opening in the first dielectric layer and a second gate opening in the second dielectric layer, wherein the first gate opening and the second gate opening have substantially equal lateral dimensions.

10. The semiconductor device of claim 1, wherein the semiconductor layer comprises a Group III-nitride semiconductor material.

11. The semiconductor device of claim 1, wherein the first dielectric layer comprises low pressure chemical vapor deposition (LPCVD) silicon nitride.

12. The semiconductor device of claim 1, wherein the second dielectric layer comprises aluminum oxide.

13. The semiconductor device of claim 1, wherein the semiconductor substrate further comprises a barrier layer adjacent the semiconductor layer to create a channel.

14. A heterostructure field effect transistor (HFET) device comprising:
   a semiconductor substrate comprising a base substrate, a Group III nitride semiconductor epitaxial layer supported by the base substrate and configured as a channel, and at least one isolation region defining an active area along a surface of the semiconductor substrate;
   first and second ohmic contacts supported by the semiconductor substrate in the active area for current flow through the channel;
   a gate supported by the semiconductor substrate in the active area to control the current flow through the channel;
   a first dielectric layer supported by the semiconductor substrate and extending across the active area; and
   a second dielectric layer supported by the semiconductor substrate in the active area and disposed between the first dielectric layer and a surface of the semiconductor substrate wherein the second dielectric layer is patterned with a first ohmic distance between a first edge of the second dielectric layer and the first ohmic contact and a second ohmic distance between a second edge of the second dielectric layer and the second ohmic contact, wherein the second dielectric layer is patterned such that the first ohmic distance and the second ohmic distance are unequal, and wherein, within the active area, the second dielectric layer is only disposed between the first ohmic contact and the second ohmic contact;

wherein the first dielectric layer comprises openings in which the first ohmic contact and second ohmic contact are disposed and wherein the second dielectric layer comprises a wet etchable material having an etch selectivity to a dry etchant of the first dielectric layer.

15. A method of fabricating a semiconductor device, the method comprising:
- forming a channel in a semiconductor substrate of the semiconductor device;
- forming at least one isolation region, defining an active area of the semiconductor device along a surface of the semiconductor substrate;
- depositing a wet-etchable etch stop dielectric layer on the surface in the active area;
- patterning the etch stop dielectric layer;
- depositing a passivation layer on the etch stop dielectric layer;
- defining ohmic contact areas by dry etching the passivation layer; and
- forming first and second ohmic contacts in the ohmic contact areas, wherein, within the active area, the etch stop layer is only disposed between the first ohmic contact and the second ohmic contact.

16. The method of claim 15, wherein forming the ohmic contact comprises implementing an anneal procedure at an anneal temperature lower than a crystallization temperature of the etch stop dielectric layer.

17. The method of claim 15, wherein patterning the etch stop dielectric layer comprises creating a first area having a first distance between a first etch stop edge and a first ohmic contact and creating a second area having a second distance between a second etch stop edge and a second ohmic contact.

18. The method of claim 15, further comprising defining a gate area by dry etching the passivation layer, wet etching the etch stop dielectric layer, and forming a gate in the gate area.

19. The method of claim 15, wherein defining the channel comprises growing first and second epitaxial Group III-nitride semiconductor layers on a base substrate to define the channel and the surface of the semiconductor substrate, respectively.

20. The method of claim 15, wherein the first dielectric layer comprises low pressure chemical vapor deposition (LPCVD) silicon nitride.

21. The method of claim 15, wherein the second dielectric layer comprises aluminum oxide.

22. The method of claim 15, wherein depositing the passivation layer comprises implementing a low pressure chemical vapor deposition (LPCVD) at an LPCVD temperature below the crystallization temperature of the etch stop dielectric layer.

23. The method of claim 22, wherein the LPCVD temperature is between about 700° C. and about 800° C.

* * * * *